United States Patent
Schaff et al.

(10) Patent No.: US 7,622,322 B2
(45) Date of Patent: Nov. 24, 2009

(54) METHOD OF FORMING AN ALN COATED HETEROJUNCTION FIELD EFFECT TRANSISTOR

(75) Inventors: William J. Schaff, Ithaca, NY (US); Jeonghyun Hwang, Ithaca, NY (US); Bruce M. Green, Gilbert, AZ (US)

(73) Assignee: Cornell Research Foundation, Inc., Ithaca, NY (US)

( * ) Notice: Subject to any disclaimer, the term of this patent is extended or adjusted under 35 U.S.C. 154(b) by 1397 days.

(21) Appl. No.: 09/858,337

(22) Filed: May 15, 2001

(65) Prior Publication Data

US 2002/0137236 A1    Sep. 26, 2002

Related U.S. Application Data

(60) Provisional application No. 60/278,566, filed on Mar. 23, 2001.

(51) Int. Cl.
     *H01L 21/00*      (2006.01)
(52) U.S. Cl. .................. 438/94; 438/172; 438/191; 438/235
(58) Field of Classification Search ................ 438/478, 438/479, 483, 503, 507, 492, 493, 758, 778, 438/779, 172, 767, 637, 606, 167, 739, 169, 438/571
See application file for complete search history.

(56) References Cited

U.S. PATENT DOCUMENTS

| | | | | |
|---|---|---|---|---|
| 4,477,311 A | * | 10/1984 | Mimura et al. | 438/492 |
| 4,795,717 A | * | 1/1989 | Okamura | 438/171 |
| 4,833,101 A | * | 5/1989 | Fujii | 117/105 |
| 4,944,246 A | * | 7/1990 | Tanaka et al. | 118/729 |
| 5,026,454 A | * | 6/1991 | Parmenter et al. | 117/105 |
| 5,087,959 A | * | 2/1992 | Omori et al. | 257/635 |
| 5,183,684 A | * | 2/1993 | Carpenter | 427/574 |
| 5,298,439 A | * | 3/1994 | Liu et al. | 438/319 |
| 5,309,004 A | * | 5/1994 | Grudkowski | 257/216 |
| 5,364,816 A | * | 11/1994 | Boos et al. | 438/172 |
| 5,571,603 A | * | 11/1996 | Utumi et al. | 428/212 |
| 5,637,146 A | * | 6/1997 | Chyi | 117/200 |

(Continued)

FOREIGN PATENT DOCUMENTS

JP      60-195978      4/1985

(Continued)

OTHER PUBLICATIONS

Araki, T., et al., "Structural Analysis of AlN Films Grown on SiC Substrate by RF-MBE and RF-MEE", *Proc. Int. Workshop on Nitride Semiconductors, IPAP Conf. Series 1*, (Sep. 24, 2000), pp. 194-197.

*Primary Examiner*—Zandra Smith
*Assistant Examiner*—Khanh B Duong
(74) *Attorney, Agent, or Firm*—Schwegman, Lundberg & Woessner, P.A.

(57) ABSTRACT

A passivation layer of AlN is deposited on a GaN channel HFET using molecular beam epitaxy (MBE). Using MBE, many other surfaces may also be coated with AlN, including silicon devices, nitride devices, GaN based LEDs and lasers as well as other semiconductor systems. The deposition is performed at approximately 150° C. and uses alternating beams of aluminum and remote plasma RF nitrogen to produce an approximately 500 Å thick AlN layer.

19 Claims, 3 Drawing Sheets

U.S. PATENT DOCUMENTS

| | | | | |
|---|---|---|---|---|
| 5,719,088 A | * | 2/1998 | Huang et al. | 438/637 |
| 5,733,827 A | * | 3/1998 | Tehrani et al. | 438/572 |
| 6,069,020 A | * | 5/2000 | Kato et al. | 438/46 |
| 6,146,458 A | * | 11/2000 | Hooper et al. | 117/106 |
| 6,281,099 B1 | * | 8/2001 | Yoshida | 438/507 |
| 6,373,174 B1 | * | 4/2002 | Talin et al. | 313/309 |
| 6,391,748 B1 | * | 5/2002 | Temkin et al. | 438/478 |
| 6,410,922 B1 | * | 6/2002 | Spartiotis et al. | 250/370.09 |
| 6,465,297 B1 | * | 10/2002 | Henry et al. | 438/238 |
| 7,061,111 B2 | * | 6/2006 | McTeer | 257/751 |

FOREIGN PATENT DOCUMENTS

| | | |
|---|---|---|
| WO | WO-01/13436 | 2/2001 |

* cited by examiner

METHOD OF FORMING AN ALN COATED HETEROJUNCTION FIELD EFFECT TRANSISTOR

CROSS-REFERENCE TO RELATED APPLICATIONS

This application claims priority to U.S. Provisional Application Ser. No. 60/278,566, filed Mar. 23, 2001, the specification of which is hereby incorporated by reference.

The present invention was made with Government support under Grant No. N00014-96-1-1223 awarded by the Office of Naval Research. The Government has certain rights in the invention.

FIELD OF THE INVENTION

The present invention relates to heterojunction field transistors, and in particular to the use of AlN to coat such transistors for improved performance and to a method of forming an AlN coating.

BACKGROUND OF THE INVENTION

Many electronic devices utilize field effect transistors for amplifiers. heterojunction field effect transistors (HFETs) have been used for high frequency amplifiers, such as for microwave transmissions. As wider bandwidth signals of greater complexity are transmitted, larger bandwidth of greater complexity are transmitted, larger bandwidth amplifiers are required to transmit them. The most common approach to broad bandwidth is to take a high power narrow band amplifier design and make it broadband by sacrificing power for bandwidth. The only way to boost the broadband power back to narrowband levels is to use a higher power amplifier transistor. GaN is a desired choice for higher microwave power transistors. GaAs transistors have also been used to less extent. GaN is a fundamentally higher power choice because it is larger bandgap which permits higher voltage operation, and higher temperature operation than GaAs. It is also more chemically stable than GaAs which gives it advantages in reliability.

Beyond high power amplifiers, there is a need for GaN receiver transistors because they can survive unintentional exposure to high voltages. For example, if something passes directly in front of a transmitting radar, the reflected beam back to the radar receiver can burn out the receiver front-end transistor.

SUMMARY OF THE INVENTION

An AlN passivation layer is applied to the surface of heterojunction field effect transistors (HFET)s. The deposition follows all other transistor processing steps in one embodiment.

In one embodiment, the passivation layer of AlN is deposited on a GaN channel HFET using molecular beam epitaxy (MBE). Using MBE, many other surfaces may also be coated with AlN, including silicon devices, nitride devices, GaN based LEDs and lasers as well as other semiconductor systems.

The deposition is performed at approximately 150° C. and uses alternating beams of aluminum and remote plasma RF nitrogen to produce an approximately 500 Å thick AlN layer. The temperature and thickness may be varied as desired. At temperatures about or higher than 300° C., melting may occur, damaging the integrity of the HFET. Lower temperatures may also be used, and in fact may provide desired poly-crystalline characteristics.

Other methods of applying the passivation layer may also be utilized, including sputtering. In one embodiment, alternating periods of deposition of Al and N are approximately two seconds in length, with two second intervals between the depositions. The times may be varied significantly, but approximate migration enhanced epitaxy, which may also be used. Such deposition provides highly conformal coverage of the passivation layer on the gate.

HFETs with AlN passivation layers are useful in a wide range of products, including microwave generated plasma lights, microwave transmitters, receivers, cellular base stations, microwave ovens, home to satellite transceivers, and collision avoidance radar for automobiles to name a few.

DETAILED DESCRIPTION OF THE INVENTION

Figure 1:
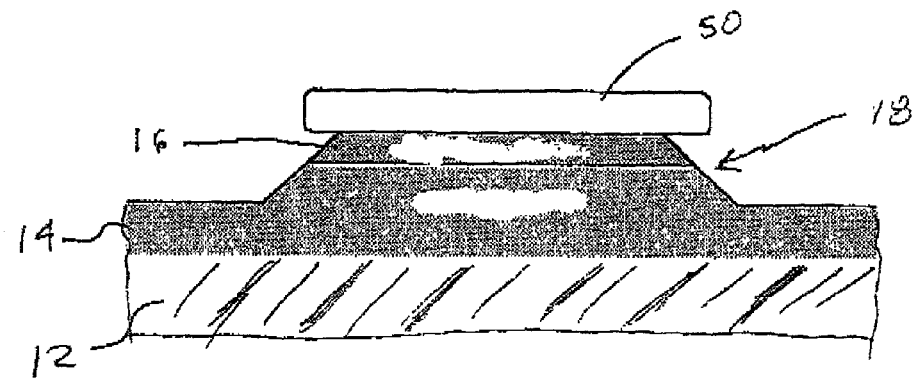
FIGS. 1, 2, 3, 4, 5, 6, 7 and 8 are block cross sections of a number of fabrication steps that are employed to fabricate a GaN based FET having an AlN passivation layer formed in accordance with the present invention.

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

A passivation layer of AlN is applied to the surface of GaN channel heterojunction field effect transistors (HFET)s or other semiconductor devices or optoelectronic devices as an optical coating by molecular beam epitaxy in one embodiment. The deposition follows all other transistor processing steps. In one embodiment, the deposition is performed at 150° C. using alternating beams of Al and remote plasma RF nitrogen to produce an approximately 500 Å thick AlN layer. Less thick layers may be used, and a thickness of approximately 2000 Å may also be used, especially for integrated capacitors. It should also be noted that other types of transistors, such as metal semiconductor field effect transistors (MESFETs) and high electron mobility transistors (HEMTs) also benefit from the passivation layer.

In one example, addition of the AlN passivation or surface layer approximately doubled the output power of HFETs in the 8 GHz range. RF output current increased from 400 mA/mm to 800 mA/mm. Vds breakdown Results may vary, and the above example is not a guarantee of performance. AlN can be deposited with great accuracy in Al to N ratio (1:1) with ease, resulting in increased yield over the use of prior passivation layers. It may also be applied using the same equipment used to fabricate the HFET. This enables the passivation layer to be applied without moving wafers to different machines. AlGaN transistors, silicon devices, nitride devices, GaN based LEDs and lasers as well as other semiconductor systems. may also be passivated in the same manner.

Heterojunction Field Effect Transistors (HFET)s made from GaN are useful for application to high power microwave amplifiers. While large channel currents and high breakdown voltages are seen for 2 dimensional electron gas (2DEG) HFETs compared to transistors made from GaAs and other related materials, these large DC channel currents are usually not obtained as peak channel currents under RF modulation. This characteristic is common for GaN HFETs which utilize 2DEGs that result from spontaneous polarization and piezo-electric induced electrons.

Further uses include broadband RF amplifiers for microwave transmissions. As wider bandwidth signals of greater complexity are transmitted, larger bandwidth amplifiers are required to transmit them. The most common approach to broad bandwidth is to take a high power narrow band amplifier design and make it broadband by sacrificing power for bandwidth. The only way to boost the broadband power back to narrowband levels is to use a higher power amplifier transistor. GaN is a fundamentally higher power choice because it has a larger bandgap which permits high voltage operation, and high temperature operation. It is also chemically stable which gives it advantages in reliability.

Beyond high power amplifiers, there is a need for GaN receiver transistors because they can survive unintentional exposure to high voltages. For example, if something passes directly in front of a transmitting radar, the reflected beam back to the radar receiver can burn out the receiver front-end transistor.

Future uses include broadband phone/video/wireless in the commercial arena. These include terrestrial base stations and consumer satellite applications. Much higher bandwidth communications from home to satellite would become economical with GaN transistors.

Low cost high power microwave transistors may also enable new sources of lighting. A microwave generated plasma is a very efficient source of high intensity light with a superior color distribution—more like sunlight. Automobile headlights and medical uses such as operating room lighting would also benefit. Cheap high power transistors could even end up replacing the klystron tubes in consumer microwave ovens.

Low cost millimeter wave transistors that can survive wide temperatures of operation are also required for collision avoidance radar for cars. Automobile manufacturers are looking at GaN as a reliable material for this application.

Figure 7:
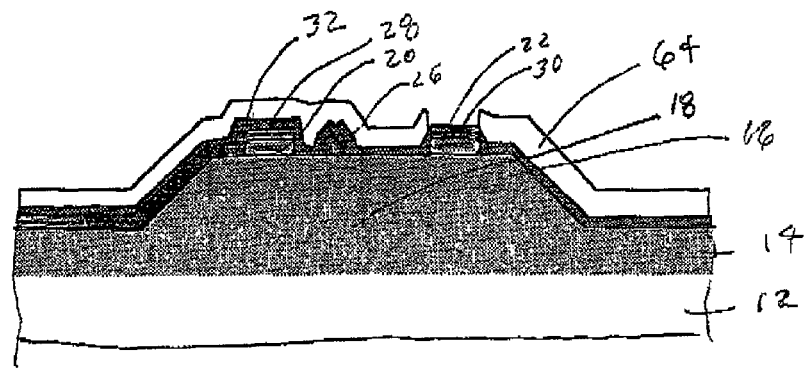
Figure 8:
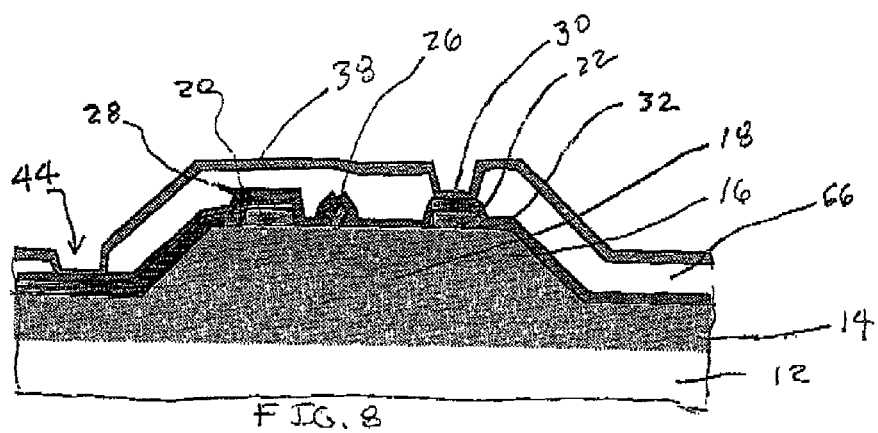
Figure 9:
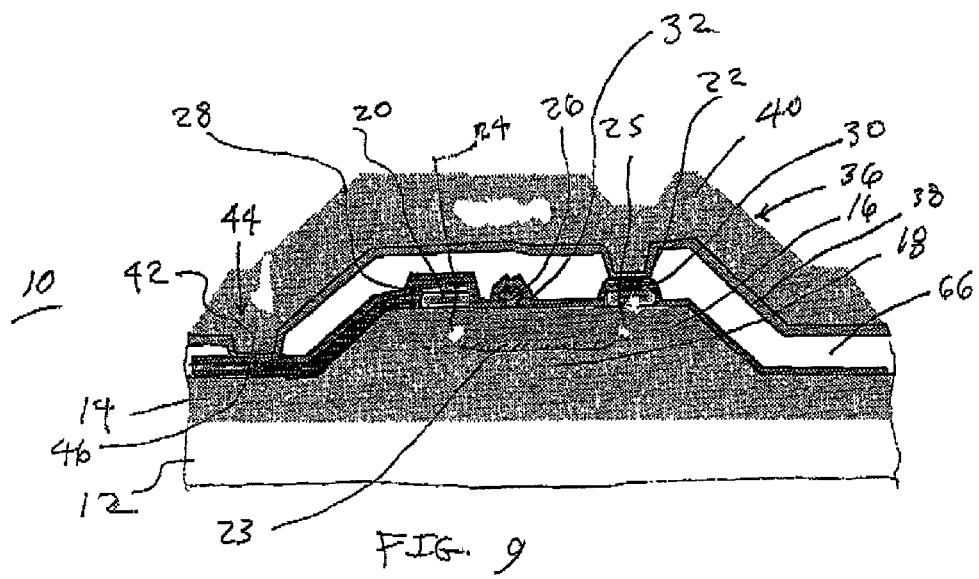
FIG. 9 is a block cross section of a complete FET having the AlN passivation layer formed thereon.

FIGS. 1-9 are schematic illustrations of a number of fabrication steps that are employed to fabricate a GaN based FET in one embodiment, with FIG. 9 showing a passivation layer of AlN formed thereon in accordance with one embodiment. The exact manner of formation of an FET may be done in many different ways, and is in no way intended to be limited by the embodiment described.

A FET 10 is formed on a substrate 12 in FIG. 9. Numbers referring to the same features in different figures are consistent between the figures. FIG. 9 shows the finished FET 10 with passivation layer, and it is first described, followed by a description of the intermediate steps illustrated by FIGS. 1-8. Substrate 12 can be any suitable material, such as sapphire, SiC, GaN, Si, etc. A buffer layer 14, formed from GaN in one embodiment, and a barrier layer 16, which is made of undoped AlGaN in the case of an HEMT, and doped GaN in the case of a MESFET, are formed on the substrate 12. Together, these form a mesa 18 that serves to isolate the FET from other FETs (not shown) on substrate 12.

A source ohmic contact 20 and a drain ohmic contact 22 are disposed on top of the barrier layer 16 for making electrical connections to a source 24 and a drain 25 respectively, that are formed in the barrier layer 16. A channel region 23 is thus formed between the source 24 and the drain 25 near the top surface of the buffer layer 14 adjacent the interface between the buffer layer 14 and the barrier layer 16, as is conventional. A gate 26 is also disposed on the barrier layer 16 between the source and the drain contacts 20 and 22. First and second metal interconnects 28 and 30, which are formed from gold in one embodiment are disposed on the source and drain contacts 20 and 22, respectively.

The AlN passivation layer 32 is disposed on top of the exposed surface of the barrier layer 16 between the source and drain contacts 20 and 22. A resist layer 34 and an airbridge metallization 36 comprised of a priming metal layer 38 and a plated gold layer 40 are optionally formed. The airbridge 36 provides a multi-level interconnect scheme as well as a top plate 42 to a metal-insulator-metal (MIM) capacitor 44, and a bottom plate 46.

To fabricate the FET 10, a buffer layer 14 and the barrier layer 16 are grown on the substrate 12 using an epitaxial growth process, such as organo-metallic vapor phase epitaxy, or molecular beam epitaxy (MBE). Next, as illustrated in FIG. 1, the definition of the active msa 18 is performed using a first photo resist mask 50 and dry etching. Once the photo resist mask 50 has been patterned, the mesa 18 is etched using either reactive-ion etching (RIE), electron-cyclotron resonance etching (ECR), or wet chemical etching, to etch the AlGaN/GaN barrier layer 16 and all or part of the GaN buffer layer 14.

Figure 2:
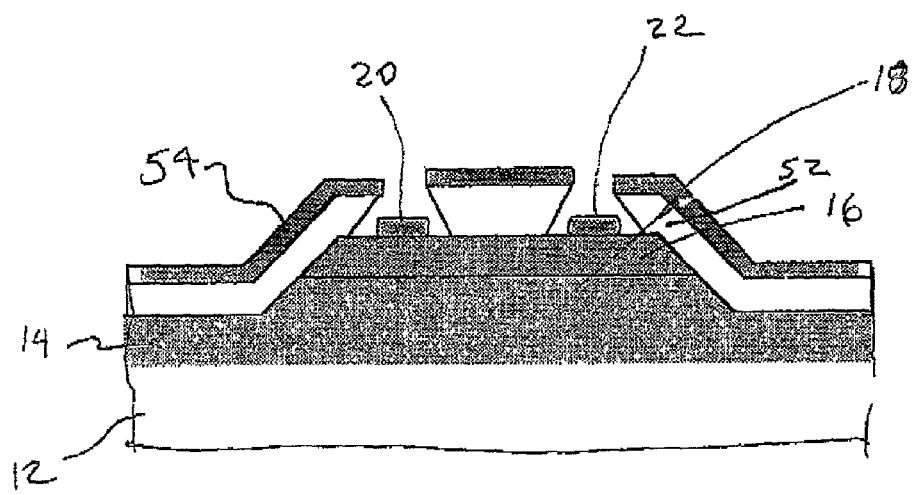

In FIG. 2, the resist mask 50 used for etching the mesa 18 is removed and resist is applied and patterned to form a second resist mask 52 which defines a "lift-off" profile for definition of the ohmic contact metalization for the source and drain contacts 20 and 22. After resist patterning, a Ti/Al/Ti/Au metal stack multilayer 54 (shown as one layer) is deposited by evaporation or some other means. After evaporation, solvents are used to dissolve the resist beneath the ohmic contact metal stack and hence lift off the overlaying metal in all areas other than where the multilayer 54 is deposited on the barrier layer 16. Following the removal of resist and excess metal, high temperature annealing (e.g., 800° C. for 30 seconds) is used to diffuse the aluminum in the metal stack multilayer 54 into the AlGaN barrier layer 16 to form the ohmic source and drain contacts 20 and 22.

Figure 3:
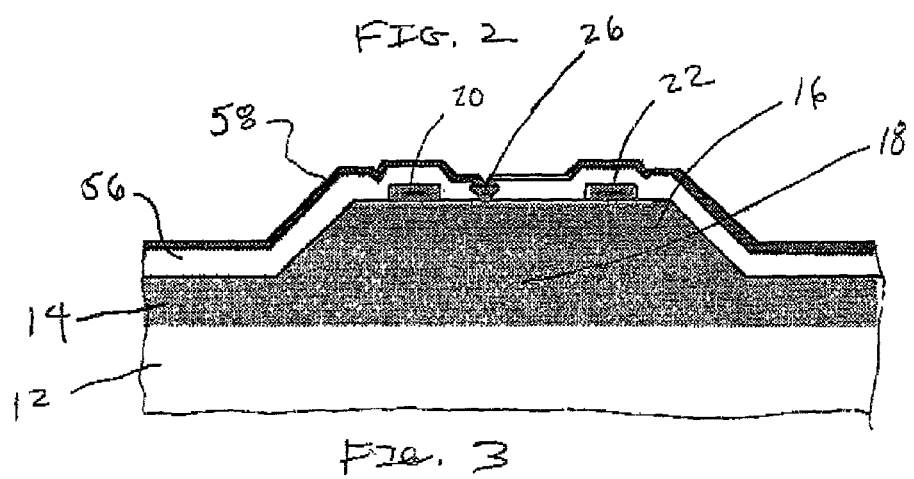
Figure 4:
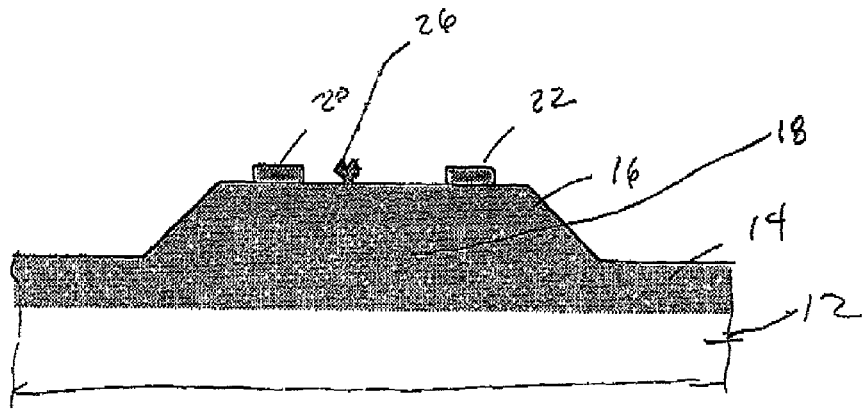

After the formation of ohmic contacts 20 and 22, another resist layer 56 is then deposited and patterned for formation of the gate 26 as shown in FIG. 3. The resist layer 56 is exposed and developed using either optical or electron beam lithography. After the patterning of the gate 26 in the resist layer 56, a Ni/Au metal stack 58 is deposited to form a rectifying contact to the AlGaN barrier layer 16. FIG. 3 shows a typical electron beam lithography process whereby the resist is exposed and developed to form the gate 26 in the shape of a "mushroom" whose large cross-sectional area minimizes the gate's electrical resistance. As in the case of the ohmic contact fabrication step, the excess metal is removed using the lift off technique as shown in FIG. 4, thereby leaving the gate 26 exposed between the source and drain ohmic contacts 20 and 22.

Figure 5:
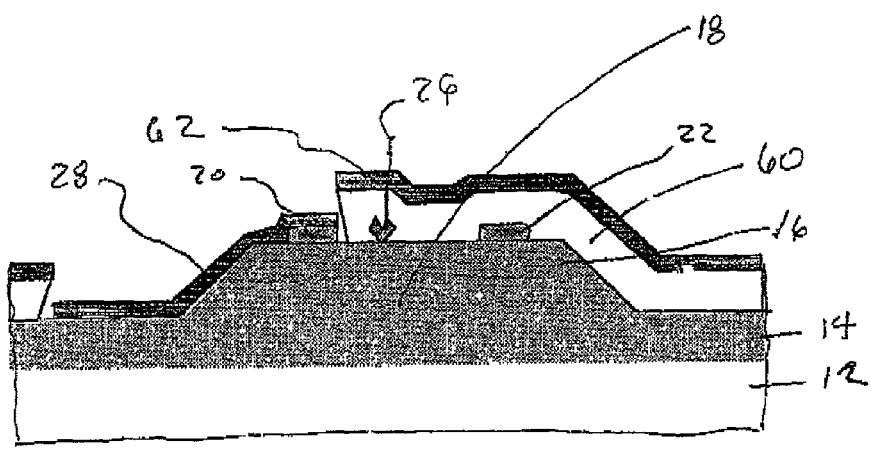

Deposition of the conductors for circuit connections and capacitor electrodes takes place after gate metallization as shown in FIG. 5. This step consists of patterning a photo resist layer 60, again using a lift off profile, depositing a metal layer 62, and then lifting off the excess metal using solvents. The deposited metal consists of a titanium adhesion layer and gold for low-resistance interconnects.

Figure 6:
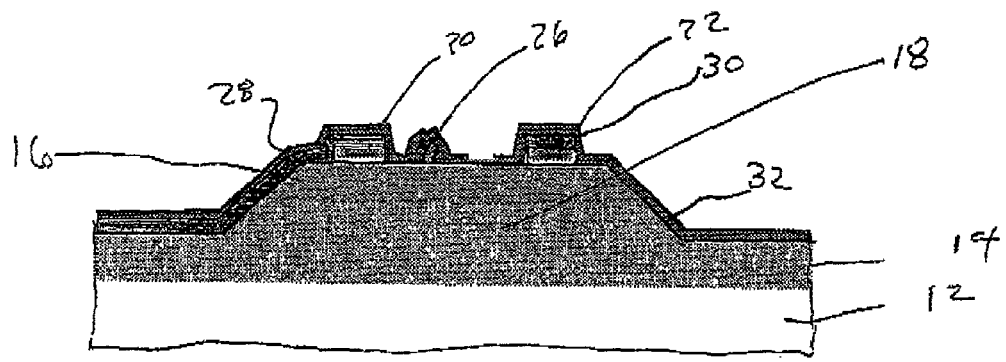

Following the deposition and patterning of the interconnect metal, the thin passivation layer of AlN is formed over the entire device wafer as shown in FIG. 6 and discussed in more detail below. After forming the passivation layer 32, photoresist is deposited and patterned to form an etch mask 64 defining windows in the passivation layer for electrical connections as illustrated in FIG. 7. Etching of AlN is performed by wet chemical etch, such as using KOH or HF. It may also be etched using a plasma etching process. The AlN can also be scratched through to the metal pads for testing.

Formation of the airbridges 36 shown in FIG. 9 follows the deposition and patterning of the passivation layer 32. In FIG. 8, this step consists of first, the deposition of the thin priming metal layer 38 on top of a layer of resist 66 patterned with holes where electrical contacts to the devices are made. After the deposition of the priming metal layer 38, another level of resist is added to define the airbridges 36. Finally, the gold layer 40 is plated on top of the primer metal layer 8 to complete the airbridge spans 36 as shown in FIG. 9.

AlN as a surface passivation layer for GaN HFETs increases the output power. Molecular beam epitaxy (MBE) is used in one embodiment to grow AlN at 150° C. The MBE technique is used in the migration enhanced epitaxy (MEE) mode in an attempt to provide the best possible sidewall coverage surrounding the gate.

In one embodiment, GaN HFET epitaxial layers are grown using MBE. The HFETs are fabricated with 0.3×100 µm T-shaped gates. A wafer on which the HFETs are formed has a 300K Hall mobility of 1450 $cm^2$/Vsec and electron sheet density of $1.1 \times 10^{13}$ $cm^{-2}$. This embodiment is just one example, and should not serve to limit the invention, as the benefit of the passivation layer may be obtained over a wide variety of parameters.

In a further embodiment, AlN is deposited on HFET devices that are contained on 1.2×1.2 cm processed wafer. The wafer is cleaned with solvents and receives a short dip in dilute HF to remove surface oxide. It still has a 1-micron thick tungsten coating on the back of the sapphire from the original MBE growth. The wafer is outgassed at 100° C. for 1 hour in vacuum before transfer into the MBE growth chamber. The AlN growth rate is 800 Å/hour. The RF plasma source is run at 350 W, 0.7 sccm $N_2$ flow and produces a background pressure of approximately $1.0 \times 10^{-5}$ T in a turbomolecular pumped Intevac® GEN II machine.

Growth takes place at a substrate temperature of 150° C. as measured by a substrate heater thermocouple. Al and N are opened for alternating 2-second periods, with 2 seconds of growth interruption between each opening. This technique is an approximation of migration-enhanced epitaxy (MEE). The substrate temperature here is presumed to be too low for growing single crystal AlN. Single crystal AlN is avoided because of the possibility that it could cause the existing AlGaN barrier to become strained beyond critical thickness with the GaN HFET channel. This would remove the piezoelectric induced 2DEG, and form dislocations that could further harm the HFET characteristics. In addition, a single crystal AlN layer could form an unwanted 2DEG at the surface of the HFET due to spontaneous polarization.

In further embodiments, poly-crystalline or amorphous forms are obtained. The structure of the crystals may be wurtzite or cubic.

MEE was chosen as an alternative to MBE for 2 reasons. First, MEE can be used to grow high quality materials, such as GaAs, at lower substrate temperatures than MBE because of enhanced surface migration of group III atoms in the absence of a group V flux. The low temperature requirement of the existing device structures makes MEE possibly more attractive. The second reason for choosing MEE is the possibility that better sidewall coverage, especially along the side of the gate, might be possible. Ga atoms preferentially migrate to the intersection between vertical features and the horizontal wafer surface.

One theory of the effect of surface nitrides deposited on HFETs is that the most important aspect of surface coverage is to better confine the electrical extension of the gate along the surface. For this reason, it is presumed that close contact, and lack of voids, along the side of the gate are important for effective surface modification.

In order to be a useful surface modification technique, AlN deposition should not cause significant degradation of other useful device properties.

CONCLUSION

An AlN passivation layer is applied to the surface of heterojunction field effect transistors (HFET)s. The deposition follows all other transistor processing steps in one embodiment. The deposition may be formed using molecular beam epitaxy (MBE), sputtering, or any other method which produces an approximately conformal coverage of the surface of the HFET. Many other surfaces may also be coated with AlN, including silicon devices, nitride devices, GaN based LEDs and lasers as well as other semiconductor systems.

The deposition is performed at approximately 150° C. and uses alternating beams of aluminum and remote plasma RF nitrogen to produce an approximately 500 Å thick AlN layer. The temperature and thickness may be varied as desired. At temperatures about or higher than 300° C., melting may occur, damaging the integrity of the HFET. Lower temperatures may also be used, and in fact may provide desired crystalline characteristics.

Using MBE, alternating periods of deposition of Al and N are approximately two seconds in length, with two second intervals between the depositions. The times may be varied significantly, but approximate migration enhanced epitaxy, which may also be used. Such deposition provides highly conformal coverage of the passivation layer on the gate between source and drain ohmic contacts.

HFETs with AlN passivation layers are useful in a wide range of products, including microwave generated plasma lights, microwave transmitters, receivers, cellular base stations, microwave ovens, home to satellite transceivers, and collision avoidance radar for automobiles to name a few.

The invention claimed is:

1. A method of forming a field effect transistor, the method comprising:
   forming a channel heterojunction field effect transistor having a top surface; and
   applying an AlN passivation layer directly on the top surface of the heterojunction channel field effect transistor at a temperature less than approximately 300 degrees Celsius to reduce uncontrolled changing of charge states in the transistor.

2. The method of claim 1 wherein the thickness of the AlN layer is between approximately 500 and 2000 Angstrom.

3. The method of claim 1 wherein Al and N are applied alternately until a desired thickness of AlN is obtained.

4. The method of claim 3 wherein a predetermined amount of time occurs between each alternate application.

5. A method of forming a field effect transistor, the method comprising:
   forming a heterojunction channel field effect transistor having a top surface; and
   applying an AlN passivation layer directly and conformally on the top surface of the heterojunction channel field effect transistor using molecular beam epitaxy at a temperature less than approximately 300 degrees Celsius.

6. The method of claim 5 wherein applying AlN comprises alternating beams of Al and RF nitrogen, wherein the beams are alternately applied for approximately two seconds until the desired thickness is obtained.

7. The method of claim 6 and further comprising delaying a predetermined amount of time between the alternating beams.

8. The method of claim 7 wherein the beams are alternately applied for approximately two seconds, and the delay is also approximately two seconds between the alternating beams until the desired thickness is obtained.

9. The method of claim 5 wherein the AlN is applied to a desired thickness is approximately 500 Angstrom.

10. A method of forming a layer of AlN of desired thickness on a semiconductor or optoelectronic device, the method comprising:
    using molecular beam epitaxy:
        applying beams of Al; and
        applying beams of remote plasma RF nitrogen alternately with the beams of Al to produce the layer of AlN of desired thickness directly on the device at a temperature less than approximately 300 degrees Celsius.

11. The method of claim 10 wherein the beams are alternately applied for approximately two seconds until the desired thickness is obtained.

12. The method of claim 10 and further comprising delaying a predetermined amount of time between the alternating beams.

13. The method of claim 12 wherein the beams are alternately applied for approximately two seconds, and the delay is also approximately two seconds between the alternating beams until the desired thickness is obtained.

14. The method of claim 10 wherein the desired thickness is approximately 500 Angstrom.

15. The method of claim 10 wherein the beams are applied at approximately 150 degrees Celsius.

16. A method of forming a layer of AlN of desired thickness on a semiconductor substrate, the method comprising:
    using molecular beam epitaxy at a temperature less than approximately 300 degrees Celsius:
        applying a beam of Al;
        waiting a predetermined period;
        applying a beam of remote plasma RF nitrogen;
        waiting a predetermined period; and
        repeating application of the beams and waiting periods to produce the layer of AlN of desired thickness.

17. The method of claim 16 wherein the desired thickness of AlN is approximately 500 Angstrom.

18. The method of claim 16 wherein the beams last approximately two seconds each application, and the waiting periods are approximately two seconds.

19. A method of forming a field effect transistor, the method comprising:
    forming a heterojunction channel field effect transistor having a top surface; and
    applying an AlN passivation layer to the top surface of the heterojunction channel field effect transistor using molecular beam epitaxy, wherein applying AlN comprises alternating beams of Al and RF nitrogen at less than approximately 300 degrees Celsius, wherein the beams are alternately applied for approximately two seconds until the desired thickness is obtained.

* * * * *

UNITED STATES PATENT AND TRADEMARK OFFICE
CERTIFICATE OF CORRECTION

PATENT NO. : 7,622,322 B2 Page 1 of 1
APPLICATION NO. : 09/858337
DATED : November 24, 2009
INVENTOR(S) : Schaff et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 65 days.

Signed and Sealed this

Twenty-sixth Day of October, 2010

David J. Kappos
*Director of the United States Patent and Trademark Office*